Jan. 19, 1960 HUNG-CHI CHANG 2,921,905

METHOD OF PREPARING MATERIAL FOR SEMICONDUCTOR APPLICATIONS

Filed Aug. 8, 1956

INVENTOR.
HUNG-CHI CHANG.

BY
Frederick Shapoe
ATTORNEY

United States Patent Office 2,921,905
Patented Jan. 19, 1960

2,921,905

METHOD OF PREPARING MATERIAL FOR SEMICONDUCTOR APPLICATIONS

Hung-Chi Chang, Pittsburgh, Pa., assignor to Westinghouse Electric Corporation, East Pittsburgh, Pa., a corporation of Pennsylvania Application August 8, 1956, Serial No. 602,839

9 Claims. (Cl. 252—62.3)

Figure 1:
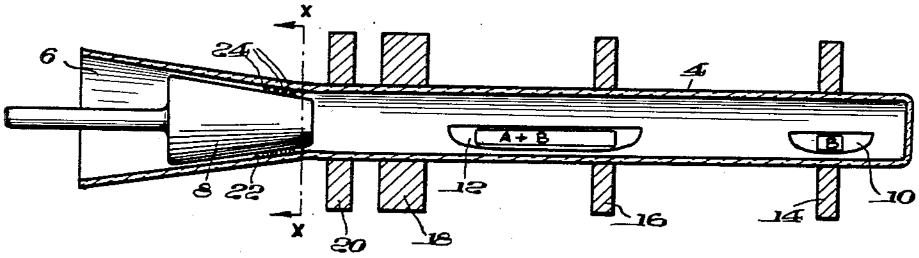

This invention relates to the art of semiconductors and it is particularly concerned with the preparation of materials of predetermined characteristics for semiconductor applications. The invention also relates to a method whereby a stoppered reaction vessel may be sealed effectively for carrying out processes at high temperatures in the vessel.

The semiconductor art requires a refined degree of control in the preparation of the various components, for the presence and distribution of impurities greatly affects the efficiency and character of the resultant article. By way of example, in the preparation of P or N type material, proper results and the production of articles of substantially identical characteristics are dependent upon precise control of the desired impurity in the material being treated, e.g. silicon, germanium, aluminum-antimonide, or the like.

Where the semiconductor is a binary compound such, for example, as indium-arsenide, its purification is attended by difficulties and problems are introduced that are not encountered in the production of elemental semiconductors. In addition to the requirement that each element of the compound be pure, the proportions of elements must be exactly stoichiometric, for an excess of either element acts as an impurity in the resultant article. Furthermore, an excess of either element in some compounds, e.g. aluminum-antimonide, produces corrosive centers which render the compound useless for practical applications.

It is an object of the present invention to provide a method of preparing materials for semiconductor applications that results in a product of predetermined characteristics; that is simple to control; and that does not require especially skilled technique for its practice.

Another object of the invention is to provide a method of preparing materials for semiconductor applications wherein the elements of the resultant semiconductor materials are present in predetermined proportions brought about through control of the pressure of a gaseous atmosphere of one of the elements.

A primary object is to provide a method of preparing a semiconductor comprising at least two elements, whereby the composition of the resulting semiconductor is predetermined by carrying out the formation of the semiconductor in an atmosphere of the more volatile element, and accurately controlling the vapor pressure of that atmosphere. The atmosphere is created by heating a non-gaseous mass of the more volatile element, said mass being large enough to insure that a portion thereof remains non-gaseous throughout the process.

Still another object is to provide a method whereby a stoppered reaction vessel may be sealed effectively for conducting a process in the vessel at an elevated temperature by condensing on the stopper material from the vapor within the vessel.

In accordance with the present method of preparing semiconductors, a gaseous atmosphere is provided in a reaction vessel wherein it is desired to prepare a semiconductor material of predetermined characteristics, and by control of the pressure of the gaseous atmosphere, the desired semiconductors can be produced. By way of illustration, where the semiconductor is a binary compound, it is crystallized from a melt in the presence of a gaseous atmosphere of the more volatile element of the compound. By controlling the pressure of the gaseous atmosphere, the composition of the melt, and hence the composition of the compound that is crystallized therefrom, can be controlled and be predetermined. Typical examples of compound semiconductors that can be prepared include group III–V compounds; typical examples are gallium-arsenide, indium-phosphide and gallium-phosphide.

Where the semiconductor is either an element or compound containing an impurity at a predetermined distribution, it is crystallized from a melt in the presence of a gaseous atmosphere of the impurity. By controlling the pressure of the gaseous atmosphere, the composition of the melt, and hence the composition of the semiconductor that is crystallized therefrom, can be controlled and be predetermined. A representative application of this aspect of the invention involves the preparation of a single crystal of a material that is being doped as it is being crystallized.

Where the semiconductor to be produced is a material containing an impurity diffused therein to a predetermined extent, the diffusion is effected by use of a gaseous atmosphere of the impurity. By controlling the temperature and pressure of the gaseous impurity, its density and hence its rate of diffusion into the semiconductor can be predetermined. Typical examples of products prepared in this embodiment include germanium having arsenic diffused therein, and compound semiconductors such as indium-arsenide having mercury or other impurity diffused therein.

In the various embodiments of the invention, the gaseous atmosphere is generated by heating in the reaction vessel a separate mass of the impurity, and of the more volatile element when necessary to establish a vapor pressure of the more volatile element of the compound. This separate mass may be used as a solid or as a liquid. Sufficient of the mass is employed to insure that some of it will remain in the non-gaseous state throughout the process.

Figure 2:
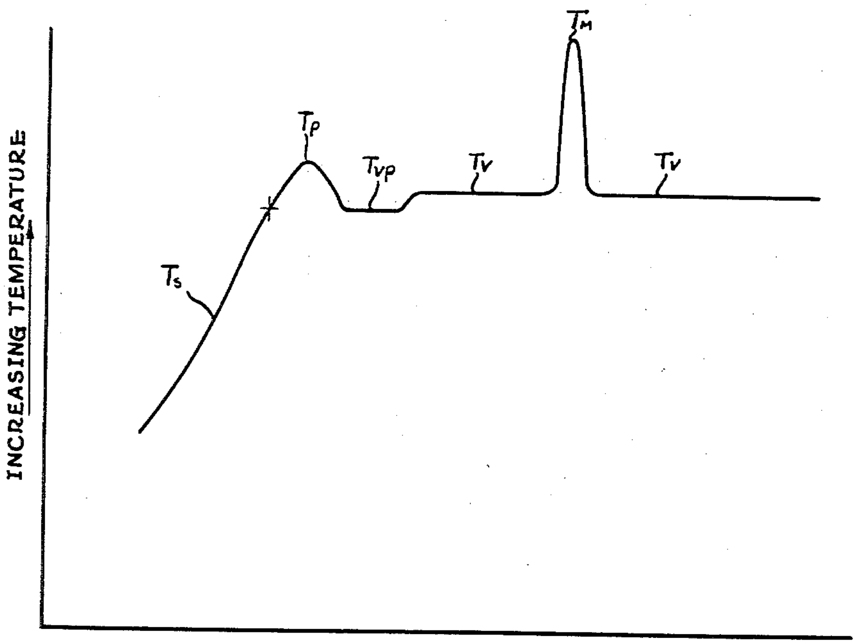

The invention will be described further in conjunction with the appended drawing in which:

Fig. 1 shows a closed reaction vessel, in section, in which the method of this invention can be practiced; and Fig. 2 shows a diagrammatic representation of the temperatures in the various parts of the reaction vessel of Fig. 1 when practicing a typical embodiment of the invention.

The drawing will be explained with particular reference to the use of the apparatus shown for the preparation of stoichiometric indium-arsenide (50:50). It is to be understood that this is for purposes of illustrating the invention, and is not to be considered as limiting.

Referring now to the drawing, the invention is carried out in a reaction vessel that may comprise a tube or vessel 4 having an opening 6 for access thereto. The temperatures and pressures that may be reached in practicing the invention can be quite high; consequently, vessel 4 should be composed of a material that is capable of withstanding the conditions encountered during the process and that does not interfere with the method, as by introducing impurities. Commercially available high temperature glass and quartz have been found to be satisfactory.

A removable plug or stopper 8 that fits within the opening 6 of the reaction vessel provides most of the closing action for its open end. Stopper 8 should be composed of a material calculated to withstand the conditions encountered during the process; quartz or high temperature glass may be used. The surface of the stopper and the opposing surface of vessel 4 may, to advantage, be ground and polished to provide as good a fit as is possible and thereby minimize the clearance that needs closing by other means.

In preparing indium-arsenide, a solid mass of arsenic, the more volatile element of the compound, is placed within the vessel 4 as at B; suitably this mass of arsenic is placed in a boat 10 utilized for that purpose. The quantity of arsenic used is sufficient to insure that a portion of it will remain solid throughout the process. An ingot or mixture of indium and arsenic is placed in vessel 4 as at A and B in Fig. 1 in a second container or boat 12.

A particular advantage of this invention is that a binary compound of the exact stoichiometric composition can be prepared without the necessity of accurately weighing its elements and then utilizing them in stoichiometric amounts, as will be apparent from the description that follows. Consequently, when preparing the ingot of indium-arsenide or when merely placing quantities of indium and the arsenic in boat 12, it is not essential that exact stoichiometric quantities be used, though it is desirable to make a rough approximation of those quantities.

When the reaction vessel is charged as just described, it is evacuated to a high vacuum, flushed with an inert gas and stopper 8 is inserted. While it is not essential to the invention that a vacuum be maintained, any gas remaining in the vessel should be non-reactive with respect to the materials used at the conditions obtaining.

A heating unit 14, adapted to heat the solid mass of arsenic, is turned on and the temperature of the arsenic is raised to generate its vapor in the vessel at a pressure in excess of the vapor pressure of arsenic in equilibrium with stoichiometric indium-arsenide at the compound's melting point. The vapor pressure of a solid is, of course, a fixed value at any temperature; also, the vapor pressure of a component of a compound, whether the compound be in the liquid state or solid state, is a fixed value at any given temperature. Consequently, the obtention of the values just described is merely a matter of utilizing a heating unit and temperature controller of adequate sensitivity to provide a predeterminable temperature. An arsenic temperature of about 610° C. is satisfactory. This temperature, which is the temperature used to generate the atmosphere of the more volatile element, will herein be called the vaporizing temperature, $T_v$.

Concurrently with the heating of the mass of arsenic, heaters 16, 18 and 20 are actuated. Heater 16 is provided to melt a portion of the indium and arsenic in boat 12. When the indium and arsenic ingot undergoes zone melting, the action of heater 16 would be to melt successive portions of the ingot; hence, heater 16 would be so adapted that it could be moved lengthwise with respect to the ingot or the ingot could be moved while the heater remained stationary. If desired, a plurality of zone melting heaters may be used to speed the process, as is conventional in the present practice of zone melting.

The melting point of indium-arsenide is about 954° C., and it is desirable to zone melt by raising the temperature slightly above the melting point of the material involved to insure prompt and complete melting, I usually control this temperature at about 960° C. The temperature used to melt the indium-arsenide is herein referred to as the melting temperature, $T_m$.

Heater 18 is provided to heat a portion of the reaction vessel, and the atmosphere therein, to the temperature at which the gaseous atmosphere, i.e. gaseous arsenic, generated from the solid mass of arsenic, equals the vapor pressure of arsenic in equilibrium with stoichiometric indium-arsenide (50:50) at its melting point. For indium-arsenide a temperature of 600° C. is employed. The temperature established through heater 18 is the vapor pressure control temperature, hereinafter sometimes referred to as $T_{vp}$, and this temperature must be the lowest temperature within the reaction vessel. The vapor pressure control temperature, because it is the lowest temperature within the reaction vessel, is the temperature which controls the pressure of the atmosphere of arsenic notwithstanding the fact that other temperatures within the vessel are higher.

Heater 20 is provided to heat a portion of the reaction vessel and the atmosphere in the vessel at that point to a temperature somewhat higher than the vapor pressure control temperature or the temperature of the solid mass of arsenic. In the preparation of indium-arsenide, I control heater 20 to provide a temperature of about 650° C. This hot area functions to determine the point at which gaseous arsenic, approaching the stopper 8, will start to condense preferably at a point to the left of the inner end of the stopper, and hence the temperature which produces it may be called the "protective temperature," $T_p$.

That portion of vessel 4 to the left of line X—X in Fig. 1, which comprises the narrow space between the opening of the vessel and the stopper 8, is maintained at a temperature which may be called the "stopper temperature," $T_s$. This temperature is relatively cold when compared with temperatures obtaining to the right of line X—X, the cold temperature always being less than the vapor pressure control temperature, $T_{vp}$. Consequently, the vapor of arsenic that reaches the stopper condenses on the cold surface of the stopper and the opposing surface 22 of vessel 4. The layer of particles 24 that builds up serves to seal the reaction vessel, for the continuous condensation of arsenic buids up and fills any minute space remaining between those surfaces. Notwithstanding this deposit of arsenic between those opposing surfaces, the vapor pressure in the reaction zone is controlled by $T_{vp}$, a higher temperature than the stopper temperature, because the reaction zone is effectively insulated from the stopper by the use of the protective temperature area described above.

All of the remaining portions of the reaction vessel and its contents to the right of line X—X in Fig. 1 are maintained at any desired temperature that is higher than the vapor pressure control temperature. However, this temperature should not be so high that it interferes with the zone melting. For the example being given, a temperature of about 610° C. is satisfactory. The temperature may be provided in any manner desired. Simply disposing that portion of the reaction vessel that is to the right of the vapor pressure control temperature in an outer vessel, the atmosphere of which is at a sufficiently high temperature, has been found to be satisfactory. In such instance, the zone melting heater 16 and the heater 14 provided for heating the arsenic may be disposed about the outer vessel and be adapted to heat through the intervening apparatus, as would an induction heater where the intervening materials were non-conductors.

After the vessel is sealed and brought to operating temperature and heaters 14, 18 and 20 have been adjusted to provide the desired temperature conditions, heater 16 is slowly moved along boat 12 to melt, successively, portions of the indium and arsenic ingot in the boat; those portions previously melted crystallize as the heater is moved away therefrom. This action is essentially that of conventional zone melting, aside from the vapor pressure control described herein. Movement of the zone melting heater 16, and the consequent melting and solidification of the ingot, is accomplished at a speed that permits equilibrium conditions to obtain. If desired, as pointed out above, a plurality of zone melting heaters can be used to speed the process.

Since the vapor pressure of a component of a compound is a fixed value at any given temperature and because the lowest temperature (T*vp*) within the closed reaction vessel is controlled at a definite value as described above, it follows that the composition of the molten compound that is in equilibrium with the gaseous atmosphere is a fixed composition. Consequently, during the zone melting any excess of arsenic in the melt in boat 12 will vaporize until the composition of the melt is at that value that is in equilibrium with the described atmosphere of arsenic. Similarly, should the quantity of the arsenic in the melt be less than that of a melt that is in equilibrium with the described atmosphere, vapor will condense to the melt until equilibrium is obtained. Hence, a melt with the exact stoichiometric composition is obtained without the necessity for using exactly stoichiometric quantities in the process, because by controlling the atmosphere the composition of the melt will adjust itself until it reaches equilibrium with the atmosphere.

The temperatures of the various parts of the reaction vessel, when practicing the invention as described in the example above, are illustrated diagrammatically in Fig. 2. The stopper area is maintained cold (T*s*) so that vapor will condense there and provide a seal around the stopper surface. The temperature of a part of the stopper thus is lower than any temperature within the reaction vessel so that when arsenic vapor contacts the stopper, the vapor will condense at the point of contact under the influence of the low temperature (T*s*). The hot area (T*p*) within the reaction vessel immediately adjacent the stopper is provided to control the point at which vapor will condense. The low flat line on the curve represents the vapor pressure control temperature (T*vp*), and it is this temperature that is the lowest of any within the reaction vessel and that requires the greatest accuracy in its control.

The high point on the curve represents the zone melting temperature (T*m*). The remaining portions of the curve, that is those portions between the vapor pressure control (T*vp*) and the zone melting temperature (T*m*) plus those to the right of the zone melting temperature, are maintained at any suitable temperature above the vapor pressure control temperature. Advantageously, this temperature is about 10° C. above the vapor pressure control. As can be observed, this temperature may be the same as the temperature (T*v*) used to generate the atmosphere from the mass of material at B, and indeed a single heater may be used to heat both those portions of the vessel and mass B.

It can be observed from the foregoing that the described method is an effective and simple procedure for producing materials for semiconductor applications. Essential control is effected through a single area, the vapor pressure control temperature (T*vp*), for other temperatures within the vessel need not be controlled to an exacting degree. Accurate results are achieved without the necessity of tediously determining the effective volume of the reaction vessel, carefully employing stoichiometric proportions of the components for the compound and the vapor phase, and without need to control accurately every point of temperature within the vessel.

In the foregoing example, the preparation of stoichiometric indium arsenide (50:50) was described. It will be apparent that any other predetermined composition also can be prepared by the described procedure such, for example, as a melt of 60:40 indium and arsenic. This would be accomplished merely by adjusting the pressure of the gaseous atmosphere to that value that equals the vapor pressure of arsenic in equilibrium with a melt of indium and arsenic of a 60:40 composition.

In the example of preparing 50:50 indium-arsenide described above, separate heating means were employed on various parts of the reaction vessel to provide the different temperature conditions. However, as was pointed out, practice of the invention merely requires accurate control of the pressure of the gaseous atmosphere while zone-melting the compound. Control of the pressure of the gaseous atmosphere can be accomplished by heating the solid mass B to that temperature which is productive of the desired pressure. To produce that pressure, the entire reaction vessel and its contents, with the exception of the molten portion of the compound undergoing zone refining, may be maintained at the necessary temperature (T*vp*), thus dispensing with the need for the plurality of heaters described. This procedure has the advantage of requiring less equipment in practicing the invention. However, it has been found advantageous to use the additional heaters described, for it is much simpler to control accurately the temperature of a small portion of the vessel than it is to maintain the entire vessel at a fixed temperature. Also, it is desirable in initiating the process to generate the gaseous atmosphere promptly so that the vessel can be sealed. Consequently, the use of a separate heater for mass B is indicated.

In another embodiment of the invention P or N type semiconductors can be prepared. To prepare such a semiconductor, germanium, silicon, or a compound such as indium-arsenide is doped with certain impurities. The quantity and distribution of the impurity in the material being treated, in addition to the specific impurity used, determine the efficiency and character of the resultant semiconductor; hence, it is desirable that the introduction of the impurity into the material being doped be accurately controlled.

In accordance with this embodiment of the invention, the controlled diffusion of an impurity into a material that is to be doped is brought about by control of the vapor pressure of the impurity that is used. In carrying out the process in apparatus as shown in Fig. 1, for example to diffuse arsenic into a germanium crystal, solid arsenic is placed in vessel 4, at B, in an amount sufficient to insure that some of the arsenic will remain as a solid throughout the process. A germanium crystal also is placed in the vessel, for example in boat 12, and the vessel is then evacuated, flushed with an inert gas and then stoppered.

The rate of diffusion of a gas into a solid or liquid is a function of the density of the gas surrounding the solid or liquid and the temperature of the solid or liquid. The density of the gas in a closed zone is a function of its pressure and temperature. The quantity of the impurity in the resultant product is a function of both the rate of diffusion and the time that diffusion is permitted to occur. Consequently, upon fixing the time of diffusion and the temperature of the material being treated, to produce a semiconductor containing a predetermined quantity and depth of impurity, one need only determine the pressure of the gaseous impurity that is necessary to produce the desired gas density and then generate and maintain that pressure of the impurity in the closed zone.

In the example being described, the arsenic is rapidly brought to operating temperature, e.g. about 300° C., by a heater such as heater 14 in Fig. 1 while the germanium crystal temperature of about 800° C. and vapor pressure control temperature (T*vp*) of 200° C. are being established. It should be understood that the temperatures given are merely by way of example, and that the actual temperatures to be used may be calculated by well-known procedures and are determined by the specific material being treated and impurity used and the diffusion characteristics desired. As in the method disclosed above for the preparation of a compound, the stopper area of the vessel is maintained cold as compared with the minimum or vapor pressure control temperature within the vessel; consequently, arsenic vapor condenses between the opposing surfaces of the stopper and reaction vessel thereby sealing the vessel. The vapor pressure in the vessel can be maintained either by controlling the temperature of the solid arsenic, or by simply using an additional heater to control a small area of the vessel at the desired temperature, as was discussed for the example above. In either instance, all other temperatures within the zone are at a higher temperature. To produce the crystal of predetermined characteristics then merely involves maintaining the temperatures until sufficient diffusion has resulted. The diffusion can be stopped by simply permitting the mass of arsenic to cool. The rate of diffusion can be changed, if desired, merely by making the appropriate change in the temperature of the arsenic. The doped crystal can be carefully cooled to room temperature at a rate that will not produce the internal strains that frequently characterize semiconductors produced by presently known processes.

Diffusion of an impurity into a semiconductor in the manner above described also can be accomplished where the semiconductor is a solid compound or is a melt of a compound or of a single crystal. Diffusion into a melt of a semiconductor material is readily accomplished by zone melting in the presence of an atmosphere of an impurity that is maintained at the desired density; controlled diffusion throughout the entire melt can thus be obtained. Once the impurity is diffused throughout a base material, its distribution can be changed as desired by zone leveling the resultant unit in the conventional manner.

A particularly advantageous application of doping, where the material being doped is a melt, involves the preparation of a doped crystal, either a single or poly crystal. By way of illustration, to obtain a single crystal that is doped to a predetermined extent, the single crystal is produced according to conventional practice; that is, the crystal is grown on a seed thereof from a reservoir of the material. By generating, in the zone where the single crystal is being grown, a gaseous atmosphere of the impurity in the manner hereinbefore described and controlling the pressure of the atmosphere of the impurity at that value which equals the vapor pressure of the impurity in equilibrium with a melt of the material being doped that contains the impurity to the predetermined composition, the impurity will condense to the melt until the predetermined composition results. Consequently, the crystal prepared will be doped in the manner desired. If, of course, the impurity in the melt is increased during the process to a value in excess of the desired value, such increase occurring due to the solidification process for example, by controlling the vapor pressure the excess impurity in the melt will vaporize until the melt reaches the predetermined composition.

From the foregoing, it can be observed that the present invention is an efficacious method of producing materials for semiconductor applications. In addition to permitting the production of binary compounds containing the components in exact stoichiometric or any other predetermined proportions and providing for controllable and predeterminable diffusion of an impurity into a material being doped, the invention is particularly advantageous for the ease with which it can be controlled. By way of example, it is obviously desirable to utilize a reaction vessel for more than a single run. On the other hand, a closed vessel frequently must be used. It is not possible to grease a stopper and expect to maintain a vessel closed at the temperatures or pressures involved in processes such as this. Other systems for maintaining temperature and pressure, such as by maintaining the reaction vessel within a second vessel that provides an inert atmosphere surrounding the reaction vessel, obviously are more complex than the described system and should only be used when necessary, as when the pressure in the reaction vessel is so great that a backing pressure is needed for safety. In this invention effective sealing of the vessel is brought about by the simple act of carrying out the process, for by maintaining the stopper area at a temperature below that of the minimum temperature within the reaction vessel, some of the vapor of the atmosphere condenses thereon sealing the vessel. Such sealing will occur even though the vapor condenses as a liquid, as would be the case normally where such materials as mercury are used. However, in that instance, if the pressure within the vessel is so great that the liquid condensate would be forced away from the stopper surface and thereby fail to seal the vessel, it may be desirable to maintain the stopper at a temperature low enough to solidify some of the condensate to obtain an effective seal.

According to the provisions of the patent statutes, I have explained the principles of my invention and have described and illustrated what I now consider to represent the best embodiments. However, I desire to have it understood that the invention may be practiced otherwise than as specifically illustrated and described.

I claim as my invention:

1. The method of preparing a crystalline product composed of a first material and an element more volatile than said first material, combined therewith, which comprises generating in a completely closed reaction zone containing said first material in a non-gaseous mass, a gaseous atmosphere of said more volatile element by maintaining a non-gaseous mass of said more volatile element at an elevated temperature in said zone, said mass of the more volatile element being present in an amount sufficient to insure that a portion thereof remains non-gaseous throughout the process, and controlling the lowest temperature in said zone including the first material at a value determined by the quantity of said more volatile element desired in the resultant product, whereby the pressure of said gaseous atmosphere of the more volatile element in said zone is at a predetermined value and it combines with the first material to produce the crystalline product.

2. The method of preparing a semiconductor material having an impurity therein to a predetermined distribution, which comprises generating in a completely closed reaction zone containing a melt of the semiconductor material to be treated, a gaseous atmosphere of the impurity by maintaining a non-gaseous mass of said impurity at an elevated temperature in said zone, said mass of the impurity being present in an amount sufficient to insure that a portion thereof remains non-gaseous throughout the process, and controlling the composition of the melt of said material by maintaining the lowest temperature in said reaction zone which lowest temperature is present in the melt at the semiconductor material at the value that results in the pressure of said gaseous atmosphere of the impurity being equal to the vapor pressure of the impurity in equilibrium with the melt of the material being treated having the impurity therein to the predetermined distribution at its melting point.

3. The method of preparing a semiconductor material having an element diffused therein to a predetermined extent, which comprises generating in a closed zone containing the semiconductor material to be treated, a gaseous atmosphere of said element by maintaining a non-gaseous mass of said element at an elevated temperature in said zone, said mass of said element being present in an amount sufficient to insure that a portion thereof remains non-gaseous throughout the process, and controlling the diffusion of the resultant gaseous element into said material being treated by maintaining the lowest temperature in said reaction zone including the semiconductor material, at the value that results in a vapor pressure and density of the gaseous atmosphere of the element about the material being treated which will diffuse the gaseous element into said material at a predetermined rate.

4. The method of preparing a mass of germanium having arsenic diffused therein to a predetermined extent, which comprises generating in a closed zone containing a mass of germanium, an arsenic atmosphere by maintaining a solid mass of arsenic at an elevated temperature in said zone, said mass of arsenic being present in an amount sufficient to insure that a portion thereof remains solid throughout the process, and controlling the diffusion of the gaseous arsenic into said germanium by maintaining the lowest temperature in said zone including the mass of germanium at the value that results in a vapor pressure and density of gaseous arsenic about the germanium which will diffuse gaseous arsenic into said germanium at a predetermined rate.

5. The method of preparing a mass of silicon having phosphorus diffused therein to a predetermined extent, which comprises generating in a closed zone containing a mass of silicon, a phosphorus atmosphere by maintaining a solid mass of phosphorus at an elevated temperature in said zone, said mass of phosphorus being present in an amount sufficient to insure that a portion thereof remains solid throughout the process, and controlling the diffusion of the gaseous phosphorus into said silicon by maintaining the lowest temperature in said zone including the mass of silicon at the value that results in a vapor pressure and density of the gaseous phosphorus about the silicon which will diffuse gaseous phosphorus into said silicon at a predetermined rate.

6. The method of preparing a solid solution of predetermined composition composed of a first element and a second more volatile element, which comprises generating in a closed zone a gaseous atmosphere of the more volatile element by maintaining in said zone a non-gaseous mass of said more volatile element at a temperature sufficient to establish its vapor in the zone at a pressure at least equal to the vapor pressure of that element in equilibrium with a melt of the solid solution that contains the elements in the predetermined proportions at the melting point of said solid solution, said mass of the more volatile element being present in an amount sufficient to insure that a portion thereof remains non-gaseous throughout the process, and crystallizing a solid solution of the elements in said zone while maintaining the lowest temperature in said zone at a value which results in the pressure of the gaseous atmosphere being equal to the vapor pressure of the more volatile element in equilibrium with a melt of a solid solution containing the elements in the predetermined proportions at the melting point of said solid solution, whereby the solid solution can be crystallized with a predetermined composition.

7. The method of preparing a binary compound in its exact stoichiometric composition composed of a first element and a second more volatile element, which comprises generating in a closed zone a gaseous atmosphere of the more volatile element of said compound by maintaining in said zone a non-gaseous mass of said more volatile element at a temperature sufficient to establish its vapor in the zone at a pressure at least equal to the vapor pressure of that element in equilibrium with a melt of the compound at its melting point, said mass of the more volatile element being present in an amount sufficient to insure that a portion thereof remains non-gaseous throughout the process, and crystallizing the compound from a melt of its elements in said zone while maintaining the lowest temperature in said zone at a value which results in the pressure of the gaseous atmosphere being equal to the vapor pressure of the more volatile element in equilibrium with a melt of the compound containing the elements in stoichiometric proportions at its melting point, whereby the compound can be crystallized with the predetermined stoichiometric composition.

8. The method of preparing crystalline indium-arsenide containing indium and arsenic in exact stoichiometric proportions, which comprises generating in a closed zone a gaseous atmosphere of arsenic by maintaining in said zone a solid mass of arsenic at a temperature that will generate from the arsenic a vapor at a pressure which is at least equal to the vapor pressure of arsenic in equilibrium with a melt of indium-arsenide at its melting point, said mass of arsenic being present in an amount sufficient to insure that a portion thereof remains solid throughout the process, and crystallizing indium-arsenide from a melt of its components in said zone while maintaining the lowest temperature in said zone at the value that results in the pressure of the gaseous arsenic being equal to the vapor pressure of arsenic in equilibrium with a melt of indium-arsenide of stoichiometric proportions at its melting point.

9. The method of preparing crystalline gallium-arsenide containing gallium and arsenic in exact stoichiometric proportions, which comprises generating in a closed zone a gaseous atmosphere of arsenic by maintaining in said zone a solid mass of arsenic at a temperature that will generate from the arsenic a vapor at a pressure which is at least equal to the vapor pressure of arsenic in equilibrium with a melt of gallium-arsenide at its melting point, said mass of arsenic being present in an amount sufficient to insure that a portion thereof remains solid throughout the process, and crystallizing gallium-arsenide from a melt of its components in said zone while maintaining the lowest temperature in said zone at the value that results in the pressure of the gaseous arsenic being equal to the vapor pressure of arsenic in equilibrium with a melt of gallium-arsenide of stoichiometric proportions at its melting point.

References Cited in the file of this patent

UNITED STATES PATENTS 2,692,839 Christensen ------------ Oct. 26, 1954
2,759,861 Collins ---------------- Aug. 21, 1956

OTHER REFERENCES

Frerichs: Physical Review, vol. 72, No. 7, Oct. 1, 1947, pp. 594–601.